United States Patent
Huang et al.

(10) Patent No.: US 12,211,727 B2
(45) Date of Patent: Jan. 28, 2025

(54) SIMULTANEOUS BONDING APPROACH FOR HIGH QUALITY WAFER STACKING

(71) Applicant: Taiwan Semiconductor Manufacturing Company, Ltd., Hsin-Chu (TW)

(72) Inventors: Xin-Hua Huang, Xihu Township (TW); Ping-Yin Liu, Yonghe (TW); Chang-Chen Tsao, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 47 days.

(21) Appl. No.: 18/191,904

(22) Filed: Mar. 29, 2023

(65) Prior Publication Data

US 2023/0238268 A1   Jul. 27, 2023

Related U.S. Application Data

(63) Continuation of application No. 17/371,537, filed on Jul. 9, 2021, now Pat. No. 11,621,186, which is a
(Continued)

(51) Int. Cl.
*H01L 21/30*   (2006.01)
*H01L 21/18*   (2006.01)
(Continued)

(52) U.S. Cl.
CPC ........ *H01L 21/6833* (2013.01); *H01L 21/187* (2013.01); *H01L 21/68* (2013.01); *H01L 21/68728* (2013.01)

(58) Field of Classification Search
CPC .............................. H01L 21/187; H01L 21/30
See application file for complete search history.

(56) References Cited

U.S. PATENT DOCUMENTS

| 7,682,933 B1 | 3/2010 | Loomis |
| 11,282,706 B2 | 3/2022 | Wagenleitner et al. |

(Continued)

FOREIGN PATENT DOCUMENTS

| JP | 2004241568 A | 8/2004 |
| KR | 20060079343 A | 7/2006 |

(Continued)

OTHER PUBLICATIONS

Edragon Technology Corporation. "What is Electrostatic Chuck?" Published in 2014.

(Continued)

*Primary Examiner* — Jeffry H Aftergut
(74) *Attorney, Agent, or Firm* — Eschweiler & Potashnik, LLC

(57) ABSTRACT

In some embodiments, the present disclosure relates to a method that includes aligned a first wafer with a second wafer. The second wafer is spaced apart from the first wafer. The first wafer is arranged on a first electrostatic chuck (ESC). The first ESC has electrostatic contacts that are configured to attract the first wafer to the first ESC. Further, the second wafer is brought toward the first wafer to directly contact the first wafer at an inter-wafer interface. The inter-wafer interface is localized to a center of the first wafer. The second wafer is deformed to gradually expand the inter-wafer interface from the center of the first wafer toward an edge of the first wafer. The electrostatic contacts of the first ESC are turned OFF such that the first and second wafers are bonded to one another by the inter-wafer interface.

20 Claims, 15 Drawing Sheets

Related U.S. Application Data continuation of application No. 16/429,145, filed on Jun. 3, 2019, now Pat. No. 11,094,575.

(51) Int. Cl.
  *H01L 21/68* (2006.01)
  *H01L 21/683* (2006.01)
  *H01L 21/687* (2006.01)

(56) References Cited

U.S. PATENT DOCUMENTS

| | | |
|---|---|---|
| 2008/0037196 A1 | 2/2008 | Yonekura et al. |
| 2010/0122762 A1* | 5/2010 | George .......... H01L 21/67092 |
| | | 156/497 |
| 2012/0038027 A1* | 2/2012 | Broekaart .......... H01L 24/94 |
| | | 438/455 |
| 2015/0210057 A1 | 7/2015 | Wagenleithner et al. |
| 2018/0122680 A1 | 5/2018 | Yang |
| 2018/0144999 A1 | 5/2018 | Lu et al. |
| 2019/0148333 A1 | 5/2019 | Chen et al. |

FOREIGN PATENT DOCUMENTS

| | | |
|---|---|---|
| KR | 20150001930 A | 1/2015 |
| TW | 201401383 A | 1/2014 |
| WO | WO-2006/038030 A2 * | 4/2006 |
| WO | WO-2012/113799 A1 * | 8/2012 |
| WO | WO-2012/126752 A1 * | 9/2012 |

OTHER PUBLICATIONS

Uhrmann, Thomas. "Heterogeneous Material Integration Enabled by Advanced Wafer Bonding." Semicon West—Advanced Manufacturing Forum, published Jul. 12, 2016.

Cole et al. "Fusion-bonded multilayered SOI for MEMS applications." SPIE Optoelectronics, Photonics and Imaging (Opto Ireland), Galway, Sept. 5-6, 2002.

Wikipedia.org "Direct Bonding." Published on Nov. 28, 2018.

Singer, Neil. "Labs patents cool tool to produce better microchips." Published Mar. 27, 1998.

Kasashima et al. "In-situ detection method for wafer movement and micro-arc discharge around a wafer in plasma etching process using electrostatic chuck wafer stage with built-in acoustic emission sensor." 2014 The Japan Society of Applied Physics, published on Mar. 5, 2014.

Joyce, Dick. "An Introduction to Infrared Detectors." NOAO Gemini Data Workshop, published on Jul. 19, 2010.

Trek, Inc. "The Electrostatic Semiconductor Wafer Clamping/Chucking System (ESC), No. 6002." Published in 2013.

Shim et al. "Dechuck Operation of Coulomb Type and Johnsen-Rahbek Type of Electrostatic Chuck Used in Plasma Processing." Plasma and Fusion Research: Letters vol. 3, 051 (2008), published on Jul. 24, 2008.

Wikipedia.org "Plasma-activated bonding." Published on May 22, 2018.

Silicon Valley Microelectronics. "Silicon on Insulator (SOI) Wafers." The date of publication is unknown. Retrieved online on Feb. 20, 2019 from https://www.svmi.com/silicon-wafers/silicon-insulator-wafers/.

Wikipedia.org "Silicon on insulator." Published on Nov. 16, 2018.

Franssila, Sami. "Wafer bonding (Chapter 17) & CMP (Chapter 16)." Introduction to Microfabrication, John Wiley and Sons, ltd. Published in 2010.

Franklin, Mark. "Wafer Bonding Enables New Technologies and Application Teikoku Taping Systems." IEEE Components, Packaging and Manufacturing Technology Society—OC Chapter, published on Aug. 29, 2013.

Non-Final Office Action dated Dec. 28, 2020 for U.S. Appl. No. 16/429,145.

Notice of Allowance dated Apr. 14, 2021 for U.S. Appl. No. 16/429,145.

Notice of Allowance dated Nov. 21, 2022 for U.S. Appl. No. 17/371,537.

* cited by examiner

SIMULTANEOUS BONDING APPROACH FOR HIGH QUALITY WAFER STACKING

REFERENCE TO RELATED APPLICATIONS

This Application is a Continuation of U.S. application Ser. No. 17/371,537, filed on Jul. 9, 2021, which is a Continuation of U.S. application Ser. No. 16/429,145, filed on Jun. 3, 2019 (now U.S. Pat. No. 11,094,575, issued on Aug. 17, 2021). The contents of the above-referenced Patent Applications are hereby incorporated by reference in their entirety.

BACKGROUND

Many modern day electronic devices, such as, for example, microelectromechanical systems (MEMS) devices, integrated circuit (IC) packages, and semiconductor-on-insulator (SOI) substrates, utilize multiple wafers that are vertically stacked and bonded to one another. For example, IC packages may utilize multiple stacked wafers to reduce package size area on a printed circuit board. Further, electronic devices may utilize an SOI substrate over a bulk substrate to, for example, reduce parasitic capacitance, reduce current leakage, and thereby improve device performance. To achieve vertically stacked and bonded wafers, wafer surfaces may be prepared (e.g., etched, cleaned), aligned, and bonded to one another without damaging the device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
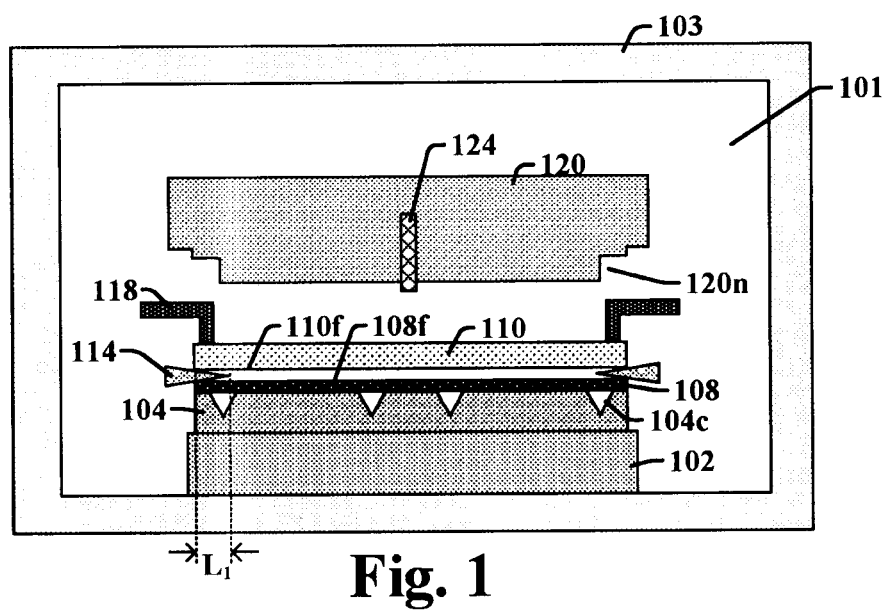
FIG. 1 illustrates a cross-sectional view of some embodiments of a wafer bonding apparatus comprising flags between edges of top and bottom wafers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Stacked wafers may be bonded to one another, where a first surface of a first wafer is bonded to a second surface of a second wafer at an inter-wafer interface. The first surface and the second surface may comprise the same or different materials. For example, in some embodiments of a silicon-on-insulator (SOI) substrate, the first surface may comprise an oxide, whereas the second surface may comprise pure silicon. In other embodiments of an SOI substrate, the first surface may comprise an oxide and the second surface may also comprise oxide. Further, in some embodiments of an integrated circuit (IC) package that utilize multiple stacked wafers, the first surface and the second surface may comprise metal contacts or wires that are aligned and bonded to one another. As electronic devices with stacked wafers become more common, wafer bonding processes are evolving to reduce defects at the inter-wafer interface, thereby improving the reliability of the electronic devices.

A method for bonding a first wafer to a second wafer may, for example, include preparing a first surface of the first wafer and a second surface of the second wafer (e.g., plasma etching), cleaning the first surface and the second surface, aligning the first wafer to the second wafer, and bringing the first surface into direct contact with the second surface. Upon an application of a force, the first wafer is bonded to the second wafer at the inter-wafer interface. However, when the first surface is brought into direct contact with the second surface, the first surface may not be parallel to the second surface, causing air to get trapped between the first and second wafers. Then, once the force is applied, the air may not escape, resulting in bubble entrapment at the inter-wafer interface. Bubble entrapment may negatively impact the final device, for example, by preventing a contact on the first surface from coupling to a contact on the second surface, by creating a non-planar top surface of the bonded wafers, or by creating a mechanical stress on each wafer, thereby weakening the bond at the inter-wafer interface. Additionally, the final device may be damaged if the force applied is too large, producing an unreliable device. Contrarily, if the force applied is too small, the bond may be weak and insufficient, again producing an unreliable device.

Various embodiments of the present disclosure provide bonding apparatuses and methods for bonding a first wafer to a second wafer to produce reliable electronic devices having stacked and bonded wafers. In some embodiments, the new method includes aligning the first wafer with the second wafer such that the first and second wafers are vertically stacked and are substantially parallel to one another. The first and second wafers are brought into direct contact with one another at an inter-wafer interface by deforming the first wafer so that the first wafer has a curved profile and the inter-wafer interface is localized to a center of the first wafer. While the first wafer is deformed to its curved profile, the second wafer maintains its substantially planar profile. The first wafer and/or second wafers are then deformed to gradually expand the inter-wafer interface from the center of the first wafer to an edge of the first wafer. This method is performed in a vacuum chamber.

The aforementioned method produces reliable devices (e.g., devices having a high wafer acceptance test performance) for many reasons. For example, by deforming the first wafer to a curved profile and localizing the inter-wafer interface to a center of the first wafer, bubble entrapment is mitigated. The first wafer and the second wafer gradually bond together as the inter-wafer interface expands from the center of the first wafer to the edge of the first wafer. Thus, any air that may be trapped is pushed out. Additionally, by ensuring that the first and second wafers are parallel to one another, wafer warpage and thus, bubble entrapment, is mitigated and wafer alignment is maintained. Additionally, because the method is performed in a vacuum chamber, bubble entrapment is mitigated because the vacuum eliminates air from between the first and second wafer.

FIG. 1 illustrates a cross-sectional view 100 of some embodiments of a wafer bonding apparatus comprising a top head with a center pin.

The cross-sectional view 100 of the wafer bonding apparatus includes a bottom chuck 104 on a stand 102 within a vacuum chamber 101, where the vacuum chamber 101 is defined by a vacuum housing 103. In some embodiments, the bottom chuck 104 may be an electrostatic chuck (ESC) that is configured to hold a bottom wafer 108 with electrostatic contacts 104c. Above the bottom wafer 108 is a top wafer 110. In some embodiments, the bottom wafer 108 has a first face 108f that comprises a same material as a second face 110f of the top wafer 110, wherein the first face 108f faces the second face 110f for wafer bonding. For example, in such embodiments, the first face 108f and the second face 110f may both comprise a semiconductor material (e.g., silicon, germanium, etc.) or a dielectric material (e.g., an oxide, nitride, carbide, etc.). In other embodiments, the first face 108f and the second face 110f may comprise different materials. For example, in such embodiments, the first face 108f may comprise a semiconductor material (e.g., silicon, germanium, etc.), whereas the second face 110f may comprise a dielectric material (e.g., an oxide, nitride, carbide, etc.).

In some embodiments, flags 114 separate the bottom wafer 108 from the top wafer 110 by a distance that is, for example, in a range of between approximately 900 micrometers and approximately 1000 micrometers to avoid the bottom wafer 108 from contacting the top wafer 110 and to maintain alignment between the top wafer 110 and the bottom wafer 108. For example, if the distance is less than 900 micrometers, the bottom wafer 108 may contact the top wafer 110, and if the distance is greater than 1000 micrometers, the top wafer 110 may become misaligned from the bottom wafer 108 during wafer bonding. Thus, the flags 114 may have a thickness in a range of between approximately 900 micrometers and approximately 1000 micrometers. The flags 114 are arranged at outer edges of the bottom and top wafers 108, 110. In some embodiments, the flags 114 directly contact the first face 108f of the bottom wafer 108 and the second face 110f of the top wafer 110. In some embodiments, the flags 114 overlap with the bottom wafer 108 and the top wafer 110 by a first length $L_1$. In some embodiments, the first length $L_1$ is at most 2 millimeters. In some embodiments, the flags 114 are tapered towards a center of the bottom and top wafers 108, 110, such that from a cross-sectional perspective, the flags 114 exhibit a triangular shape. In other embodiments, the flags 114 may exhibit a more rectangular shape from a cross-sectional view perspective. In some embodiments, the flags 114 comprise a material that is softer than materials of the top wafer 110 and the bottom wafer 108 such that the flags 114 do not damage the bottom and top wafers 108, 110. For example, in some embodiments, the bottom and top wafers 108, 110 comprise silicon, and the flags 114 may comprise polyetheretherketone or a ceramic, which is softer than silicon.

In some embodiments, the top wafer 110 is aligned with the bottom wafer 108. In some embodiments, the top wafer 110 maintains alignment due to clamps 118 that rest on outer edges of the top wafer 110. In some embodiments, the bottom wafer 108 and the top wafer 110 are aligned outside of the vacuum chamber 101 defined by the vacuum housing 103, and then transported into the vacuum chamber 101 and the vacuum housing 103. Thus, the clamps 118 maintain alignment of the bottom wafer 108 and the top wafer 110 during transport. Centered above the top wafer 110 is a top head 120. The top head 120 is configured to move towards and away from the bottom chuck 104 at different speeds and forces. Such movement may, for example, be achieved by hydraulics, a linear actuator, or some other suitable mechanism. Embedded in the top head 120 is a center pin 124. In some embodiments, the center pin 124 is arranged in the center of the top head 120, and over the center of the top wafer 110. In other embodiments, the center pin 124 may be off-center from the top wafer 110. The center pin 124 has a bottommost surface that is below a bottommost surface of the top head 120, wherein the bottommost surface of the top head 120 faces the bottom chuck 104. Thus, the center pin 124 is configured to contact the top wafer 110 first when the top head 120 moves towards the top wafer 110. In some embodiments, the clamps 118 may be present when the top head 120 moves towards the top wafer 110. Thus, in some embodiments, the top head 120 may be shaped to fit between the clamps 118. For example, in the cross-sectional view 100, the top head 120 has notches 120n to accommodate for the clamps 118. In other embodiments, the clamps 118 may be removed before the top head 120 moves towards the top wafer 110. Further, the center pin 124 and the clamps 118 comprise materials that are softer than materials of the top wafer 110 such that the center pin 124 and the clamps 118 do not damage the top wafer 110. For example, in some embodiments, the top wafer 110 may comprise silicon, and the center pin 124 and the clamps 118 may comprise polyetheretherketone and/or a ceramic, which are softer than silicon.

The wafer bonding apparatus of cross-sectional view 100 is within the vacuum housing 103 defining the vacuum chamber 101 because the vacuum chamber 101 assists in bonding of the bottom wafer 108 to the top wafer 110 and at least partially eliminates any air in the chamber that could get trapped between the bottom and top wafers 108, 110. Additionally, in some embodiments, the center pin 124 is centered over the top wafer 110 and flags 114 are moveable at the edges of the bottom and top wafers 108, 110, such that bonding propagates from the centers of the bottom and top wafers 108, 110 to the edges of the bottom and top wafers 108, 110, thereby mitigating air entrapment.

Figures 2A, 2B:
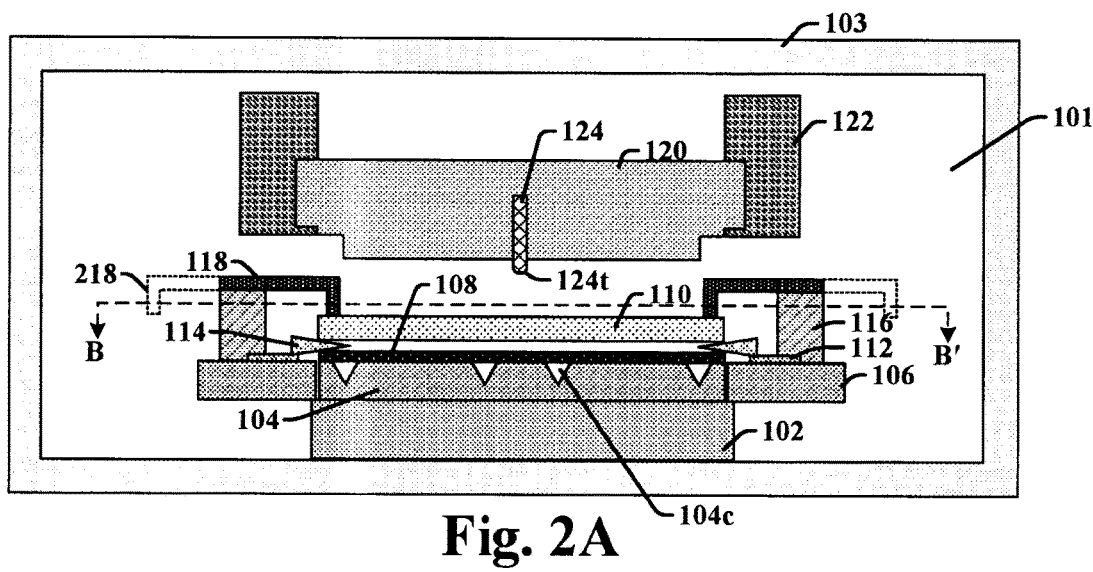
FIGS. 2A and 2B illustrate various views of some additional embodiments of a wafer bonding apparatus comprising flags between edges of top and bottom wafers in which the flags are connected to an outer chuck.

FIG. 2A illustrates a cross-sectional view 200A of some additional embodiments of a wafer bonding apparatus comprising a top head with a center pin.

Figure 5:
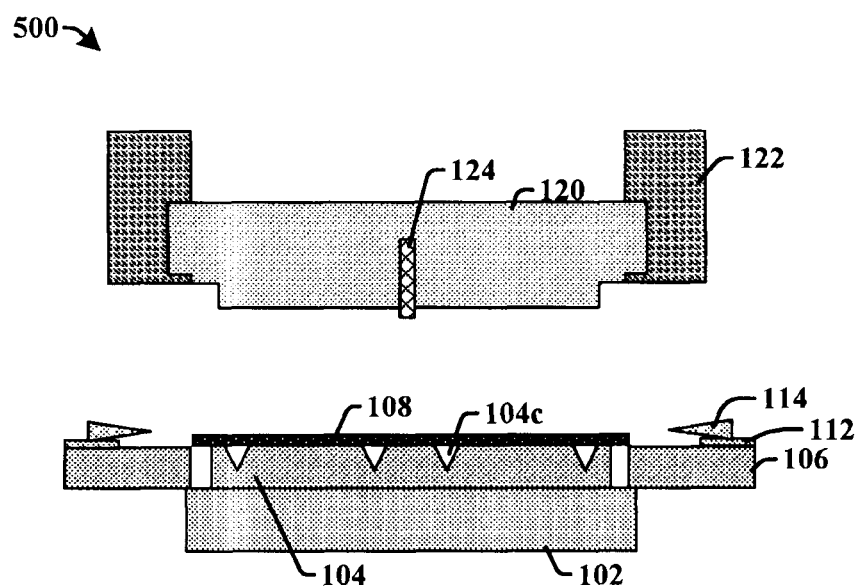
FIGS. 5-12 illustrate cross-sectional views of some embodiments of a method for wafer bonding comprising a top head with a center pin and further comprising a plurality of flags between top and bottom wafers.

The cross-sectional view 200A of the wafer bonding apparatus includes some additional features compared to the wafer bonding apparatus in the cross-sectional view 100 of FIG. 1. In some embodiments, the flags 114 rest on and/or are secured to a flag support mechanism 112. The flag support mechanism 112 supports the flags 114 and also may be configured to move the flags 114 between a first orientation and a second orientation. The first orientation of the flags 114 is illustrated in cross-sectional view 200A, wherein inner portions of the flags 114 directly overlie outer portions of the bottom wafer 108 and/or the bottom chuck 104. The second orientation of the flags 114 is where the inner portions of the flags 114, or any portions of the flags 114, do not overlie the bottom chuck 104 (as illustrated in FIG. 5, for example). Similarly, in some embodiments, the clamps 118 rest on and/or are secured to a clamp support mechanism 116. The clamp support mechanism 116 supports the clamps 118 and may be configured to move the clamps 118 between a first position and a second position. The first position of the clamps 118 is illustrated in cross-sectional view 200A, wherein the clamps 118 overlie and contact the top wafer 110. The second position of the clamps 118 is where the clamps 118 do not overlie the top wafer 110. For example, in some embodiments, the clamps 118 may be in the second position when the clamps 118 are within outlines 218. In some embodiments, the flag support mechanism 112 and the clamp support mechanism 116 rest on an outer chuck 106, wherein the outer chuck 106 surrounds the bottom chuck 104. Thus, the outer chuck 106, the flag support mechanism 112, the flags 114, the clamp support mechanism 116, and the clamps 118 define a top chuck of the wafer bonding apparatus, in some embodiments.

Further, in some embodiments, the top head 120 is supported by a top head support mechanism 122. The top head support mechanism 122 may be configured to move the top head 120 towards and away from the bottom chuck 104. Additionally, in some embodiments, the center pin 124 may have a tip 124t that is concave outwards towards the bottom chuck 104. In other embodiments, the tip 124t of the center pin 124 may have a planar surface that is parallel to a bottommost surface of the top head 120. The concave outwards tip 124t reduces the force applied per area on the bottom and top wafers 108, 110, thereby mitigating damage during wafer bonding. By reducing the area of the center pin 124, the concave outwards tip 124t reduces air entrapment between the bottom and top wafers 108, 110.

FIG. 2B illustrates a top view 200B of some embodiments of a top wafer secured by an outer chuck comprising flags and clamps.

The top view 200B of FIG. 2B illustrates the same features as in cross-sectional view 200A of FIG. 2A taken along line B-B', except with some different characteristics. For example, in some embodiments, the flags 114 are offset from and do not underlie the clamps 118, whereas in other embodiments, as in the cross-sectional view 200A of FIG. 2A, the flags 114 are illustrated as underlying the clamps 118. As illustrated in the top view 200B, in some embodiments, the top wafer 110 overlies portions of the flags 114 and is below portions of the clamps 118. In some embodiments, the outer chuck 106 is a continuous ring from the top view 200B perspective. In some embodiments, there are at least 3 flags 114. Having at least 3 flags allows for sufficient separation of the bottom wafer 108 from the top wafer 110 and advantageously allows the bottom and top wafers 108, 110 to have substantially planar profiles extending laterally in parallel, as illustrated in the cross-sectional view 200A of FIG. 2A. In some embodiments, the flags 114 are substantially evenly spaced along a periphery of the outer chuck 106. In some embodiments, two clamps 118 are utilized, whereas in other embodiments, more than two clamps 118 are utilized. In some embodiments, the clamps 118 are evenly spaced along the periphery of the outer chuck 106. For example, the clamps 118 in top view 200B are spaced across the diameter of the top wafer 110.

A notch alignment mark 202 may be used to align the bottom wafer (108 of FIG. 2A) to the bottom chuck 104 (of FIG. 2A) and to align the top wafer 110 to the bottom wafer (108 of FIG. 2A). For example, in some embodiments, the bottom and top wafers 108, 110 may each have a notch configured to fit around the notch alignment mark 202, where the notch alignment mark 202 protrudes out from the bottom chuck 104. To avoid interference with the clamps 118 and the flags 114, the notch alignment mark 202 is offset from the flags 114 and the clamps 118, in some embodiments.

Figure 3:
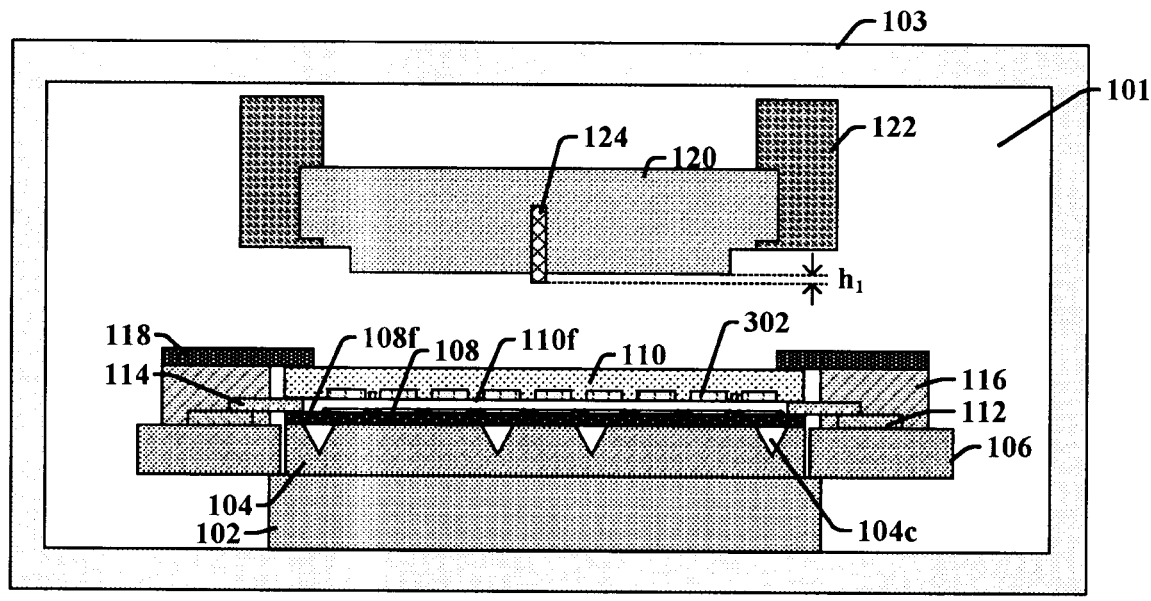
FIG. 3 illustrates a cross-sectional view of an additional embodiment of a wafer bonding apparatus comprising flags between edges of top and bottom wafers in which the top and bottom wafers comprise wires to be bonded to one another.

FIG. 3 illustrates a cross-sectional view 300 some alternative embodiments of the wafer bonding apparatus in cross-sectional view 200A of FIG. 2A.

The cross-sectional view 300 includes some embodiments of clamps 118 that are substantially rectangular shaped from a cross-sectional view perspective. In other embodiments, as in the clamps 118 of FIG. 2A, the clamps 118 may exhibit a different shape, such as an "L" shape, for example, from a cross-sectional view perspective. Similarly, in some embodiments, the flags 114 may have a substantially rectangular shape from a cross-sectional view perspective, as shown in cross-sectional view 300. In some embodiments, the flags 114 are configured to separate the first face 108f of the bottom wafer 108 from the second face 110f of the top wafer 110 by a distance that is in a range of between approximately 900 micrometers and approximately 1000 micrometers to avoid the bottom wafer 108 from contacting the top wafer 110 and to maintain alignment between the top wafer 110 and the bottom wafer 108. Thus, in some embodiments, the flags 114 have a thickness that is in a range of between approximately 900 micrometers and approximately 1000 micrometers. The flags 114 are also configured such that the first face 108f of the bottom wafer 108 is substantially parallel to the second face 110f of the top wafer 110. In some embodiments, the first face 108f and the second face 110f comprise one or more back-end-of-line metal wires 302 to be aligned and subsequently bonded to one another to form an electrical connection between the bottom wafer 108 and the top wafer 110. In some embodiments, the bottom and top wafers 108, 110 may comprise 12 inch wafers having a wafer thickness in a range of between approximately 70 micrometers and approximately 75 micrometers. In some embodiments, the bottom wafer 108 may have a thickness that is greater than, less than, or equal to a thickness of the top wafer 110.

In some embodiments, the bottommost surface of the center pin 124 is spaced from the bottommost surface of the top head 120 by a distance $h_1$. In some embodiments, the distance $h_1$ is in a range of approximately 4 millimeters and approximately 6 millimeters. Further, in some embodiments, the center pin 124 has a cylindrical shape throughout a majority of its length, with a small diameter that is in a range of between approximately 1 millimeter and approximately 3 millimeters. The small diameter reduces the area of contact between the initial contact between the center pin 124, the top wafer 110, and the bottom wafer 108, and subsequently reduces air entrapment between the bottom and top wafers 108, 110 during wafer bonding.

Figure 4:
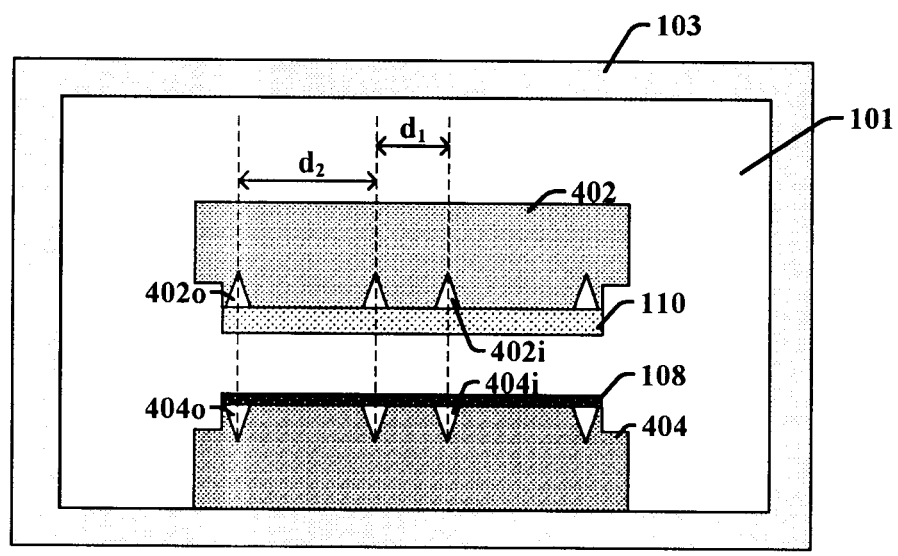
FIG. 4 illustrates a cross-sectional view of an additional embodiment of a wafer bonding apparatus comprising top and bottom chucks that are electrostatic chucks (ESC).

FIG. 4 illustrates a cross-sectional view 400 of some embodiments of a wafer bonding apparatus comprising a top ESC and a bottom ESC.

The cross-sectional view 400 includes a bottom electrostatic chuck (ESC) 404 configured to hold a bottom wafer 108 and a top ESC 402 configured to hold a top wafer 110. The bottom ESC 404 comprises a first pair of inner electrostatic contacts 404i between a first pair of outer electrostatic contacts 404o. Each electrostatic contact of the first pair of inner electrostatic contacts 404i is spaced from the center of the bottom ESC 404 by an equal distance, and each electrostatic contact of the first pair of outer electrostatic contacts 404o is spaced from the center of the bottom ESC 404 by an equal distance. The first pair of inner electrostatic contacts 404i are spaced apart by a first distance $d_1$, which, in some embodiments, may be in a range of between approximately 3 centimeters and approximately 5 centimeters. Each electrostatic contact of the first pair of outer electrostatic contacts 404o may be spaced from a nearest neighbor of one of electrostatic contacts of the first pair of inner electrostatic contacts 404i by a second distance $d_2$, which, in some embodiments, may be in a range of between approximately 9 centimeters and approximately 11 centimeters. In other embodiments, the second distance $d_2$ may be in a range of between approximately 6 centimeters and approximately 8 centimeters. Similarly, the top ESC 402 has a second pair of inner electrostatic contacts 402i and a second pair of outer electrostatic contacts 402o that share the same spacing characteristics, represented by $d_1$ and $d_2$, as the first pair of inner electrostatic contacts 404i and the first pair of outer electrostatic contacts 404o of the bottom ESC 404, respectively. In alternative embodiments, the second pair of inner electrostatic contacts 402i and the second pair of outer electrostatic contacts 402o have different spacing characteristics than the first pair of inner electrostatic contacts 404i and the first pair of outer electrostatic contacts 404o. The top ESC 402 is aligned to the bottom ESC 404, such that the second pair of outer electrostatic contacts 402o directly overlie the first pair of outer electrostatic contacts 404o and that the second pair of inner electrostatic contacts 402i directly overlie the first pair of inner electrostatic contacts 404i. In alternative embodiments, the second pair of outer electrostatic contacts 402o are laterally offset from the first pair of outer electrostatic contacts 404o and/or the second pair of inner electrostatic contacts 402i are laterally offset from the first pair of inner electrostatic contacts 404i. In some embodiments, the bottom wafer 108 and the top wafer 110 may be aligned to the bottom ESC 404 and the top ESC 402, respectively, through notch alignment marks (see, e.g., 202 of FIG. 2B). The bottom wafer 108 and the top wafer 110 are aligned such that the top wafer 110 directly overlies the bottom wafer 108 and such that the bottom and top wafers 108, 110 are parallel to one another.

The top ESC 402 and the bottom ESC 404 are configured to respectively hold the top wafer 110 and the bottom wafer 108 when their electrostatic contacts (402o/402i and 404o/404i, respectively) are "on." In some embodiments, the electrostatic contacts (402o/402i and 404o/404i) may each be selectively turned "on" to electrostatically hold the wafer (108, 110) by applying a first voltage bias to the electrostatic contact (402o/402i and 404o/404i), whereas the electrostatic contacts (402o/402i and 404o/404i) may be selectively turned "off" to remove the electrostatic force that holds the wafer (108, 110) by applying a second voltage bias to the electrostatic contact (402o/402i, 404o/404i). For example, when a wafer is on an electrostatic chuck and an electrostatic contact of the electrostatic chuck is "on", at that electrostatic contact, the wafer is electrostatically held onto the electrostatic chuck by an electrostatic force. When the electrostatic contact is turned "off," there is no electrostatic force to hold the wafer onto the electrostatic chuck at that electrostatic contact.

In some embodiments, the top ESC 402 is also configured to move towards or away from the bottom ESC 404 while maintaining alignment. Such movement may, for example, be achieved by hydraulics, a linear actuator, or some other suitable mechanism. In some embodiments, the bottom ESC 404 rests above the vacuum housing 103 within the vacuum chamber 101 and remains stationary during wafer bonding.

FIGS. 5, 6A, 6B, 11A-11C, and 12 illustrate various views 500, 600A, 600B, 1100A-1100C, and 1200 of some embodiments of a method for bonding a first wafer to a second wafer using a top head with a center pin. Although FIGS. 5, 6A, 6B, 11A-11C, and 12 are described in relation to a method, it will be appreciated that the structures disclosed in FIGS. 5, 6A, 6B, 11A-11C, and 12 are not limited to such a method, but instead may stand alone as structure independent of the method.

It will be appreciated that before the method illustrated in the various views 500, 600A, 600B, 1100A-1100C, and 1200 of FIGS. 5, 6A, 6B, 11A-11C, and 12, the bottom and top wafers (e.g., 108 and 110 of FIG. 1) may undergo surface treatments (e.g., plasma etching) and/or cleanings (e.g., distilled water treatment) to have first and second faces (e.g., 108f and 110f of FIG. 1) that are more susceptible to bonding to one another upon contact of the first face (e.g., 108f of FIG. 1) to the second face (e.g., 110f of FIG. 1).

As shown in the cross-sectional view 500 of FIG. 5, the bottom wafer 108 is aligned over the bottom chuck 104 outside of the vacuum housing (103 of FIG. 1) defining the vacuum chamber (101 of FIG. 1). In some embodiments, a distance between outer sidewalls of the bottom chuck 104 may be less than the diameter of the bottom wafer 108. In other embodiments (see, e.g., FIG. 1), a distance between the outer sidewalls of the bottom chuck 104 may be greater than or equal to the diameter of the bottom wafer 108. In embodiments where the bottom chuck 104 is a bottom ESC, upon alignment of the bottom wafer 108 on the bottom chuck 104, the electrostatic contacts 104c of the bottom chuck 104 are turned "on" by applying a first voltage bias to electrostatically hold the bottom wafer 108, and to keep the bottom wafer 108 substantially flat or in other words, planar. Flags 114 on flag support mechanisms 112 are arranged at a first orientation, wherein the flags 114 are away from, and do not overlie the bottom chuck 104 and/or the bottom wafer 108.

In some embodiments, during the alignment of the bottom wafer 108 on the bottom chuck 104, the bottom chuck 104 is arranged on the stand 102. In some embodiments, the outer chuck 106 is also arranged on the stand 102. In some embodiments, during the alignment of the bottom wafer 108 on the bottom chuck 104, the top head 120, center pin 124, and top head support mechanism 122 are arranged above the bottom chuck 104. In other embodiments, the top head 120, center pin 124, and top head support mechanism 122 are located in the vacuum housing (103 of FIG. 1) defining the vacuum chamber (101 of FIG. 1), and thus, do not directly overlie the bottom chuck 104 during the bottom wafer 108 alignment. In some embodiments where there are clamps (see, e.g., 118 of FIG. 2A), the clamps (see, e.g., 118 of FIG. 2A) are in the second position during alignment of the bottom wafer 108 on the bottom chuck 104, such that the clamps do not overlie the bottom chuck 104 and/or the bottom wafer 108.

Figure 6A:
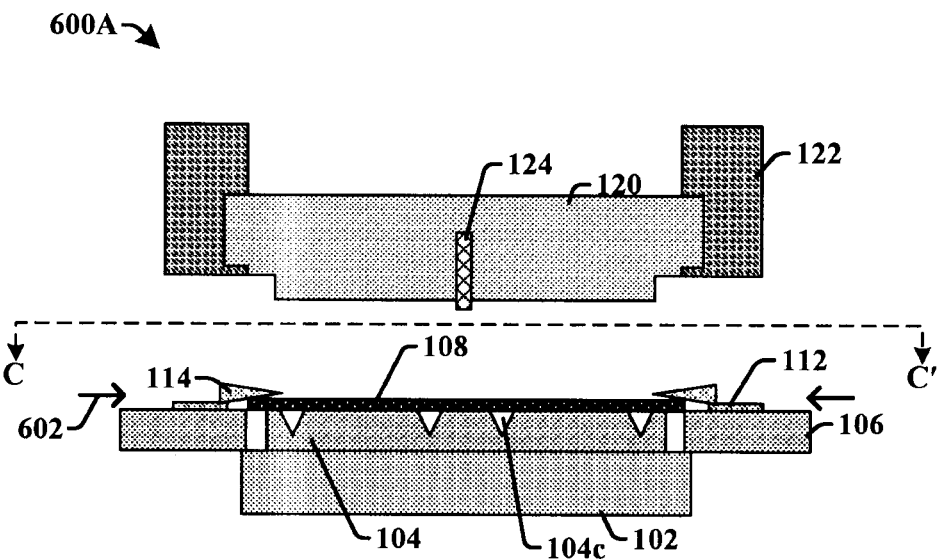

As shown in the cross-sectional view 600A of FIG. 6A, the flags 114 are moved 602 into the second orientation, wherein at least inner portions of the flags 114 directly overlie outer portions of the bottom wafer 108 and the bottom chuck 104. In some embodiments, the flag support mechanisms 112 also move during the moving 602 of the flags 114 into the second orientation. For example, the flag support mechanisms 112 may move laterally towards the bottom wafer 108. In other embodiments, the flag support mechanisms 112 are stationary while the flags 114 are moved 602. In some embodiments where there are clamps (see, e.g., 118 of FIG. 1), the clamps 118 remain in their second position during the moving 602 of the flags 114 into the second orientation.

Figure 6B:
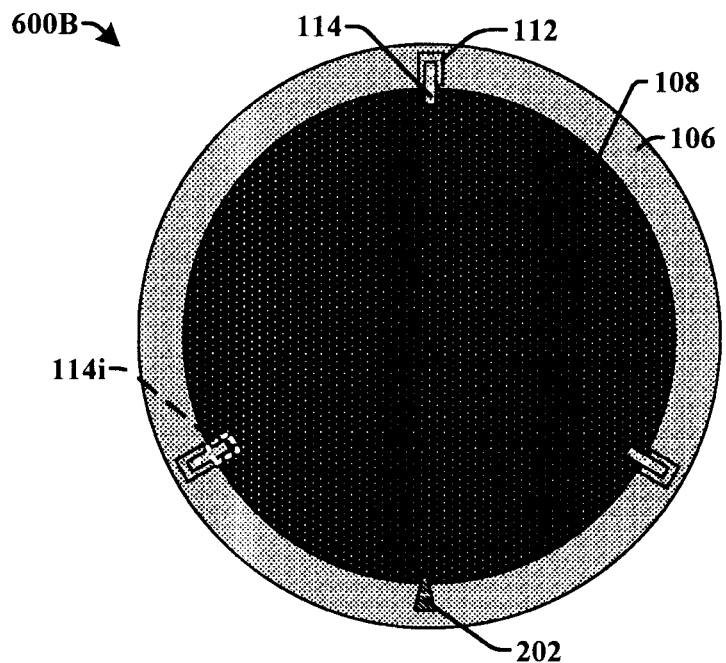

FIG. 6B illustrates a top view 600B of some embodiments taken along line C-C' of FIG. 6A. In some embodiments, in the second orientation of the flags 114, inner portions 114i of the flags 114 overlie the bottom wafer 108. In some embodiments, the bottom wafer 108 is aligned over the bottom chuck 104 using the notch alignment mark 202. For example, in some embodiments, the bottom wafer 108 may have a notch configured to fit around the notch alignment mark 202, where the notch alignment mark 202 protrudes out from the bottom chuck 104.

Figure 7:
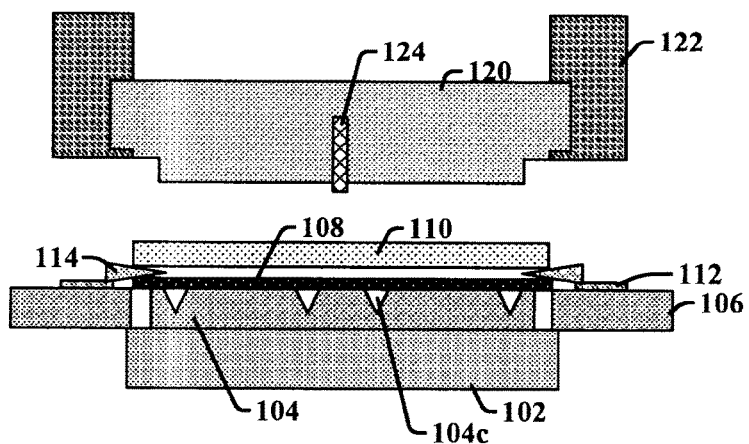

As shown in the cross-sectional view 700 of FIG. 7, the top wafer 110 is placed over and aligned to the bottom wafer 108. In some embodiments the top wafer 110 is aligned to the bottom wafer 108 using the same notch alignment mark (see, e.g., 202 of FIG. 6B). The top wafer 110 overlies the inner portions (see, e.g., 114i of FIG. 6B) of the flags 114. In some embodiments where clamps (see, e.g., 118 of FIG. 1) are used, the clamps are moved into their first position after the top wafer 110 is aligned to the bottom wafer 108, such that the clamps 118 overlie and contact the top wafer 110 to maintain alignment (see, e.g., FIG. 1).

Figure 8:
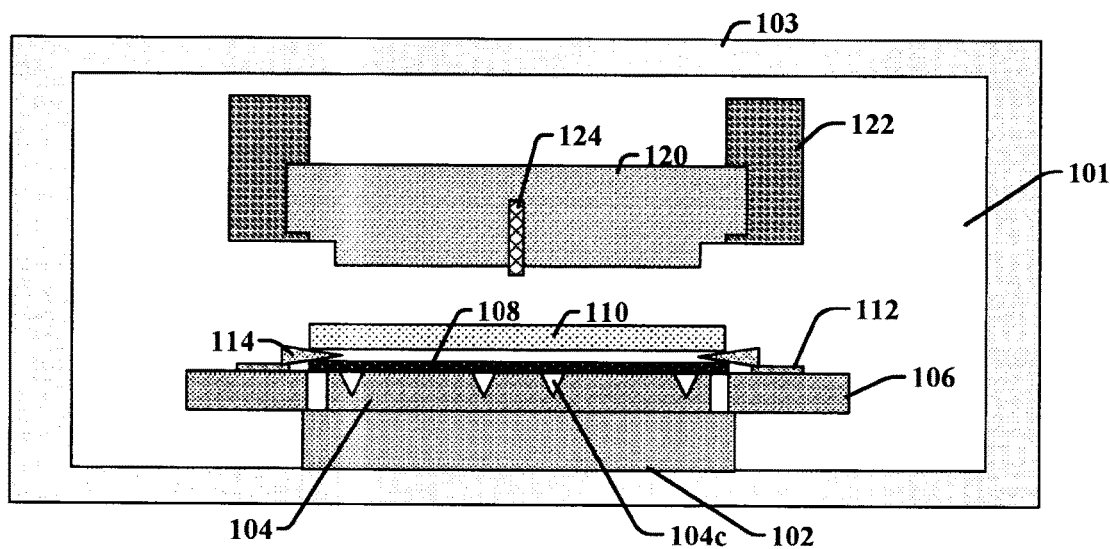

As shown in cross-sectional view 800 of FIG. 8, the elements of cross-sectional view 700 of FIG. 7 are transported into the vacuum housing 103 that defines the vacuum chamber 101. In some embodiments, the stand 102, the top head 120, the center pin 124, and/or the top head support mechanism 122 are already in the vacuum housing 103 that defines the vacuum chamber 101, such that a robot transports the outer chuck 106, the bottom chuck 104, the bottom wafer 108, the top wafer 110, the flags 114, and the flag support mechanism 112 into the vacuum housing 103 of the vacuum chamber 101. During transport, the bottom chuck 104 prevents the bottom wafer 108 from moving, and in some embodiments, the clamps (see, e.g., 118 of FIG. 1) prevent the top wafer 110 from moving. The flags 114 maintain separation and parallelism between the bottom wafer 108 and the top wafer 110. Once transport into the vacuum chamber 101 is complete, gases are exhausted from the vacuum chamber 101 to at least partially create a vacuum in the vacuum chamber 101. In some embodiments, the vacuum chamber 101 may be set to a pressure in a range of between approximately 0.01 millibar and approximately 100 millibars.

Figure 9:
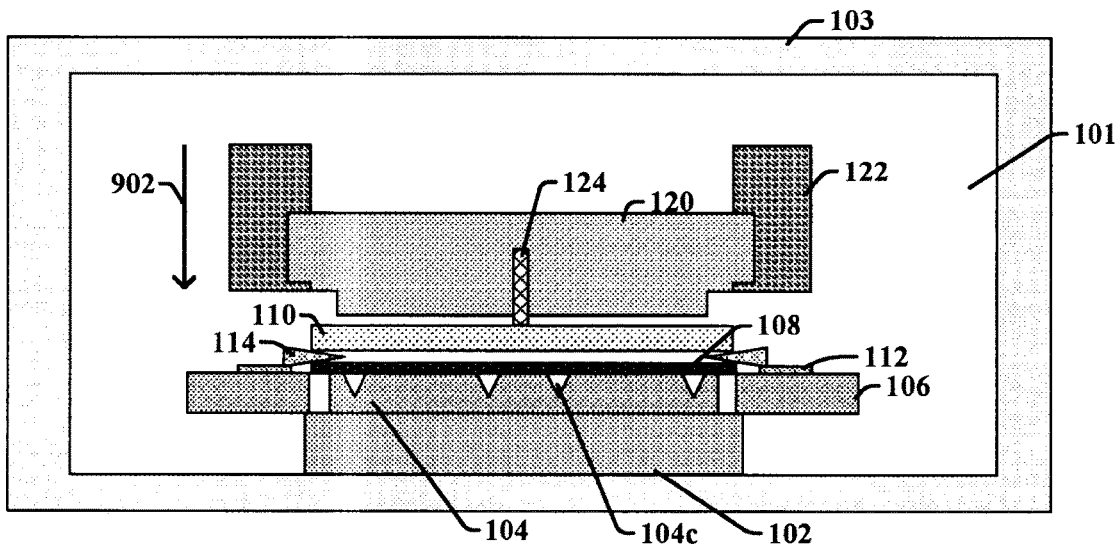

As shown in cross-sectional view 900 of FIG. 9, the top head 120 is moved 902 towards the bottom chuck 104, until the center pin 124 contacts a center of the top wafer 110. In some embodiments where clamps (see, e.g., 118 of FIG. 1) are used, the clamps may remain in the first position during movement 902 of the top head 120. In other embodiments, the clamps (see, e.g., 118 of FIG. 1) may be moved into their second position before movement 902 of the top head 120.

Figure 10:
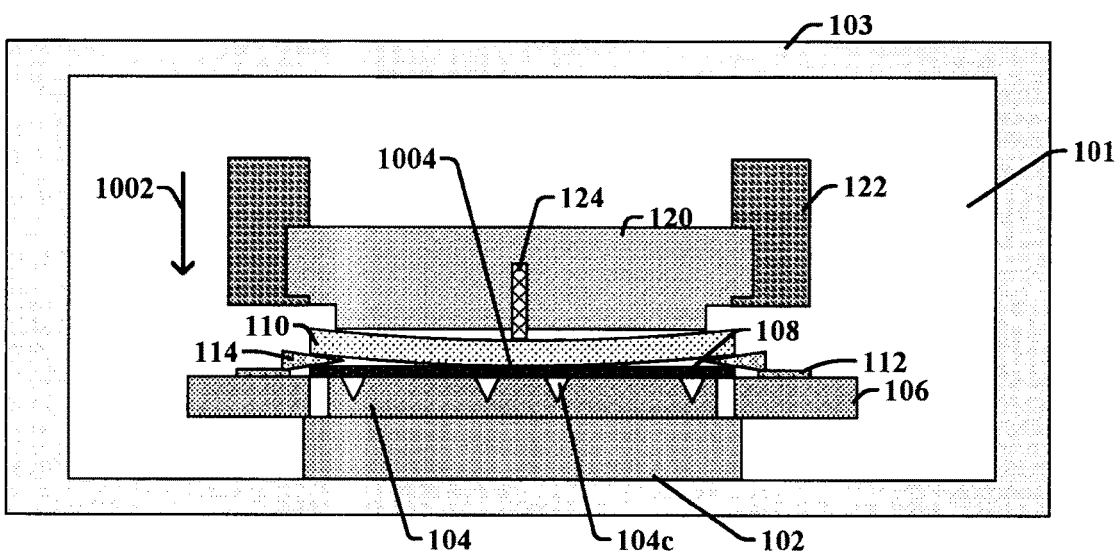

As shown in cross-sectional view 1000 of FIG. 10, the top head 120 is further moved 1002 towards the bottom chuck 104 such that the top wafer 110 is bowed. The center pin 124 in contact with the top wafer 110 causes the center of the top wafer 110 to contact a center of the bottom wafer 108, while outer edges of the top wafer 110 remain separated from outer edges of the bottom wafer 108 due to the flags 114. In some embodiments, the top head 120 does not contact the top wafer 110; the center pin 124 only contacts and applies direct force to the top wafer 110. The bottom wafer 108 remains flat or planar due to the electrostatic contacts 104c of the bottom chuck 104. The bottom wafer 108 contacts the top wafer 110 at an inter-wafer interface 1004, where bonding is initiated. Upon the formation of the inter-wafer interface 1004, movement of the top head 120 towards the bottom chuck 104 stops. The inter-wafer interface 1004, in some embodiments, is at the center of the bottom and top wafers 108, 110 and also centered around the center pin 124.

In some embodiments, an area of the inter-wafer interface 1004, where bonding is initiated, has a radius that is at least 2 millimeters. In some embodiments, the area of the inter-wafer interface 1004 comprises 1 percent of an area of the bottom wafer 108. In some embodiments, the center pin 124 has a small diameter that is in a range of between approximately 1 millimeter and approximately 3 millimeters. The small diameter reduces the area of the inter-wafer interface 1004 to reduce air entrapment between the bottom and top wafers 108, 110. Further, in other embodiments, the center pin 124 has a tip (see, e.g., 124t of FIG. 2A) that is concave outwards towards the bottom chuck 104 to minimize the area of the of the inter-wafer interface 1004 to reduce air entrapment between the bottom and top wafers 108, 110.

In some embodiments, the movement 902 of the top head 120 in FIG. 9 and the movement 1002 of the top head 120 in FIG. 10 occur in one continuous motion at a same movement rate. In some embodiments, the center pin 124 applies a force onto the top wafer 110 that may be in a range of between approximately 10 Newtons and approximately 10,000 Newtons, without damaging the bottom and top wafers 108, 110. In some embodiments, the vacuum chamber 101 also aids in the initiation of contact between the bottom and top and top wafers 108, 110 and prevents air entrapment between the bottom and top wafers 108, 110.

Figure 11A:
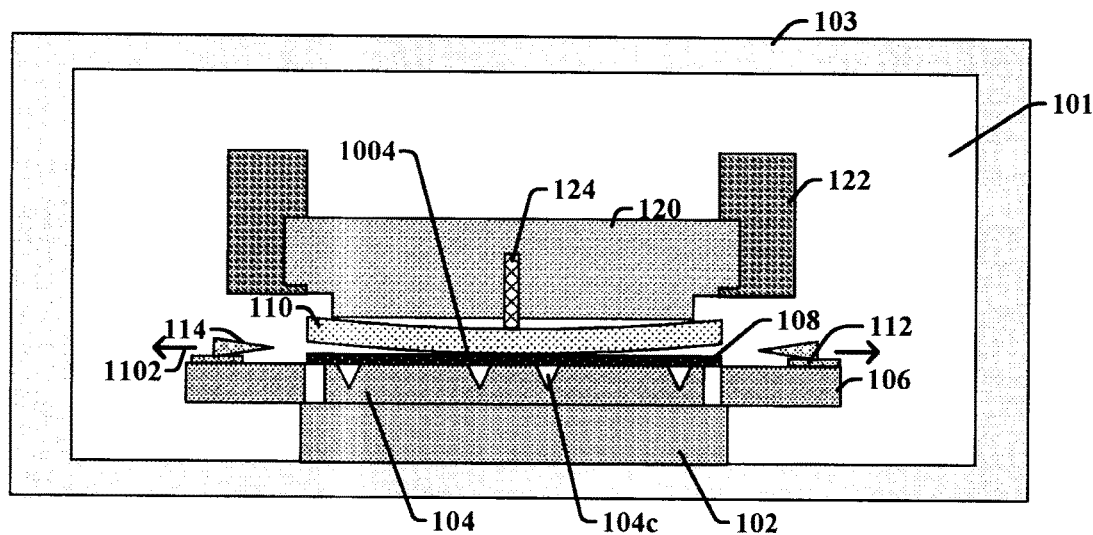

As shown in the cross-sectional view 1100A of FIG. 11A, the flags 114 are moved 1102 into their first orientation, such that the flags 114 are no longer between the bottom wafer 108 and the top wafer 110. As the flags 114 are moved 1102 into their first orientation, the inter-wafer interface 1004 expands towards the outer edges of the bottom and top wafers 108, 110. The expansion of the inter-wafer interface 1004 occurs very quickly (e.g., less than one second). Thus, the cross-sectional view 1100A illustrates the bottom and top wafers 108, 110 at a first time just after the flags 114 are moved 1102 into their first orientation.

Figure 11B:
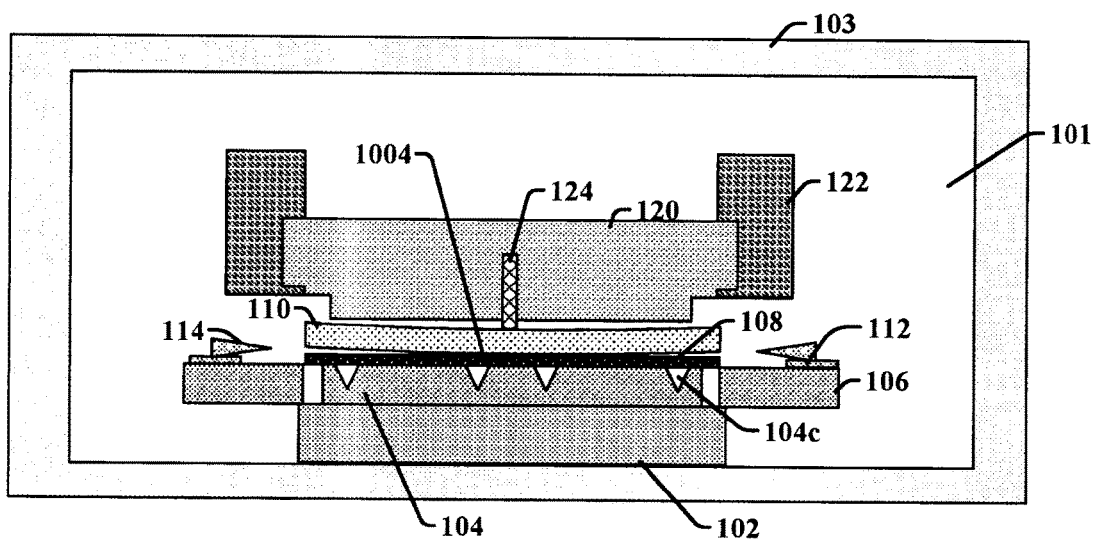

As shown in the cross-sectional view 1100B of FIG. 11B, the inter-wafer interface 1004 continues to expand towards the outer edges of the bottom and top wafers 108, 110. The center pin 124 is still in contact with the top wafer 110. The top wafer 110 is less bowed in the cross-sectional view 1100B of FIG. 11B than in the cross-sectional view 1100A of FIG. 11A. The cross-sectional view 1100B illustrates the bottom and top wafers 108, 110 at a second time, wherein the second time is just after the first time.

Figure 11C:
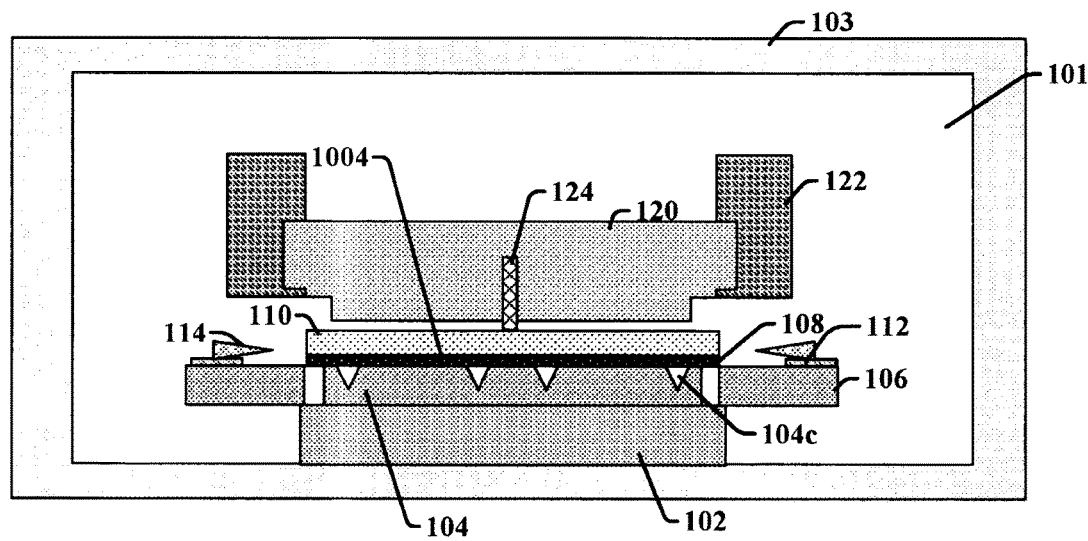

As shown in the cross-sectional view 1100C of FIG. 11C, the inter-wafer interface 1004 continues to expand towards the outer edges of the bottom and top wafers 108, 110, such that the first face (108*f* of FIG. 1) of the bottom wafer 108 is in contact and bonded to the second face (110*f* of FIG. 1) of the top wafer 110. The top wafer 110 is substantially flat and is substantially co-planar with the bottom wafer 108. The cross-sectional view 1100C of FIG. 11C illustrates the bottom and top wafers 108, 110 at a third time, wherein the third time is just after the second time. In some embodiments, the bottom wafer 108 remains flat or planar throughout the cross-sectional views 1100A-1100C of FIGS. 11A-11C. The cross-sectional view 1100C of FIG. 11C also illustrates the completion of the inter-wafer interface 1004 expansion from the centers of the bottom and top wafers 108, 110 to the outer edges of the bottom and top wafers 108, 110. The expansion of the inter-wafer interface 1004 from the centers of the bottom and top wafers 108, 110 to the outer edges of the bottom and top wafers 108, 110 advantageously pushes air out of the inter-wafer interface 1004, mitigating air entrapment between the bottom wafer 108 and the top wafer 110, thereby producing a more reliable wafer bond.

Figure 12:
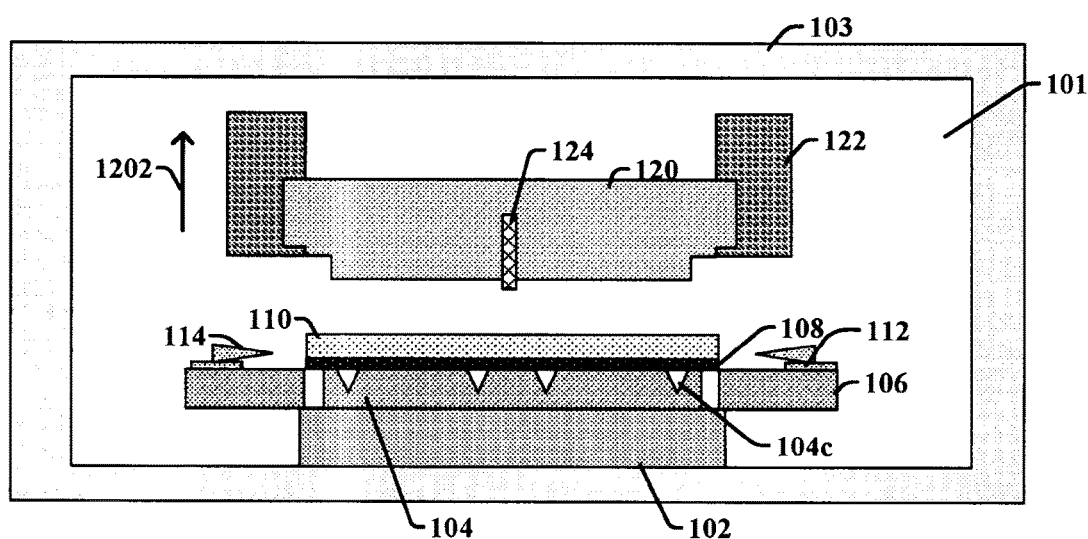

As shown in the cross-sectional view 1200 of FIG. 12, the top head 120 is moved 1202 away from the bottom chuck 104, such that the center pin 124 no longer contacts the top wafer 110. In some embodiments, the bonded bottom and top wafers 108, 110 are then removed from the vacuum housing 103 that defines the vacuum chamber 101 and are further taken off of the bottom chuck 104 by turning the electrostatic contacts "off" for further processing steps.

Figure 13:
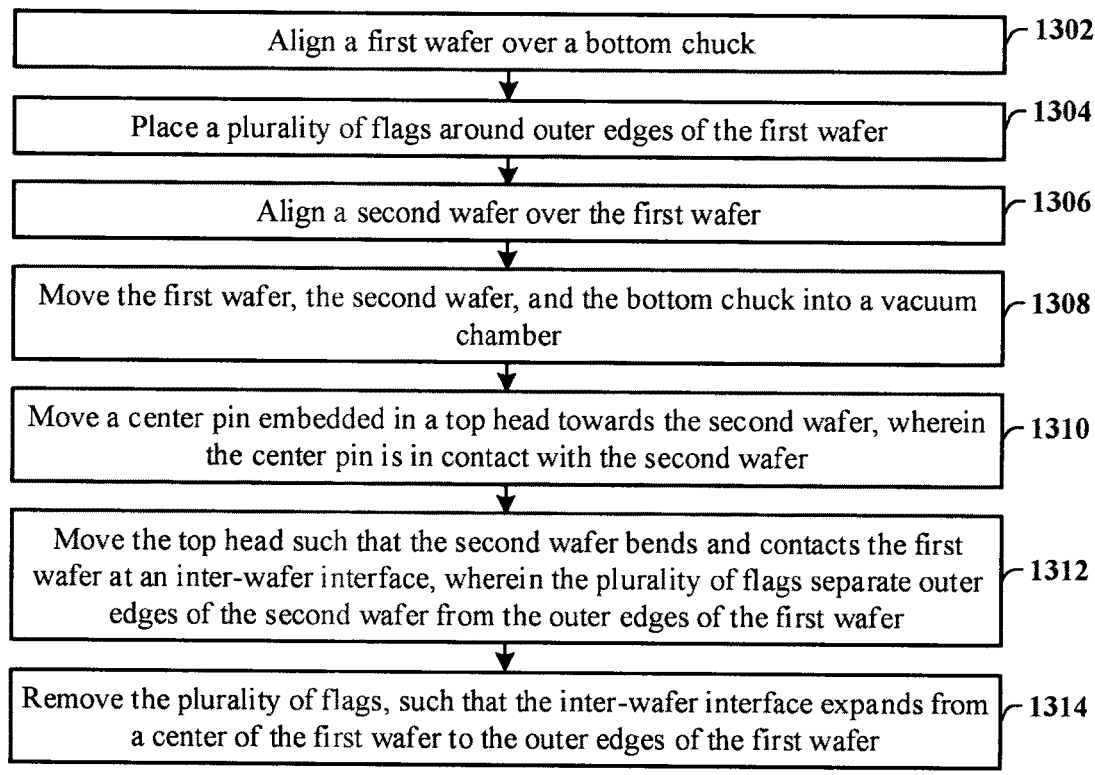
FIG. 13 illustrates a flow diagram of some embodiments of the method of FIGS. 5, 6A, 6B, 11A-11C, and 12.

FIG. 13 illustrates a flow diagram of some embodiments of a method 1300 of bonding a first wafer to a second wafer using a top head with a center pin as shown in FIGS. 5-12. In some embodiments, the top wafer corresponds to a first wafer and the bottom wafer corresponds to a second wafer.

While method 1300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1302, a first wafer is aligned over a bottom chuck. FIG. 5 illustrates a cross-sectional view 500 of some embodiments corresponding to act 1302.

At 1304, a plurality of flags are placed around outer edges of the first wafer. FIGS. 6A and 6B illustrate a cross-sectional view 600A and corresponding top view 600B of some embodiments corresponding to act 1304.

At 1306, the second wafer is aligned over the first wafer. FIG. 7 illustrates a cross-sectional view 700 of some embodiments corresponding to act 1306.

At 1308, the first wafer, the second wafer, and the bottom chuck are moved into a vacuum chamber. FIG. 8 illustrates a cross-sectional view 800 of some embodiments corresponding to act 1308.

At 1310, a center pin that is embedded in a top head is moved towards the second wafer, wherein the center pin is in contact with the second wafer. FIG. 9 illustrates a cross-sectional view 900 of some embodiments corresponding to act 1310.

At 1312, the top head is moved such that the second wafer bends and contacts the first wafer at an inter-wafer interface, wherein the plurality of flags separate outer edges of the second wafer from the outer edges of the first wafer. FIG. 10 illustrates a cross-sectional view 1000 of some embodiments corresponding to act 1312.

At 1314, the plurality of flags are removed such that the inter-wafer interface expands from a center of the first wafer to the outer edges of the first wafer. FIGS. 11A-11C illustrate cross-sectional views 1100A-C of some embodiments corresponding to act 1314.

FIGS. 14-18, 19A, 19B, and 20 illustrate cross-sectional views 1400-1800, 1900A, 1900B, and 2000 of some embodiments of a method for bonding a first wafer to a second wafer using a top electrostatic chuck (ESC) and a bottom ESC in a vacuum chamber. Although FIGS. 14-18, 19A, 19B, and 20 are described in relation to a method, it will be appreciated that the structures disclosed in FIGS. 14-18, 19A, 19B, and 20 are not limited to such a method, but instead may stand alone as structure independent of the method.

It will be appreciated that before the method illustrated in cross-sectional views 1400-1800, 1900A, 1900B, and 2000 of FIGS. 14-18, 19A, 19B, and 20, the bottom and top wafers (e.g., 108 and 110 of FIG. 1) may undergo surface treatments (e.g., plasma etching) and cleanings (e.g., distilled water treatment) to have first and second faces (e.g., 108*f* and 110*f* of FIG. 1) that are more susceptible to bonding to one another upon contact of the first face (e.g., 108*f* of FIG. 1) to the second face (e.g., 110*f* of FIG. 1).

Figure 14:
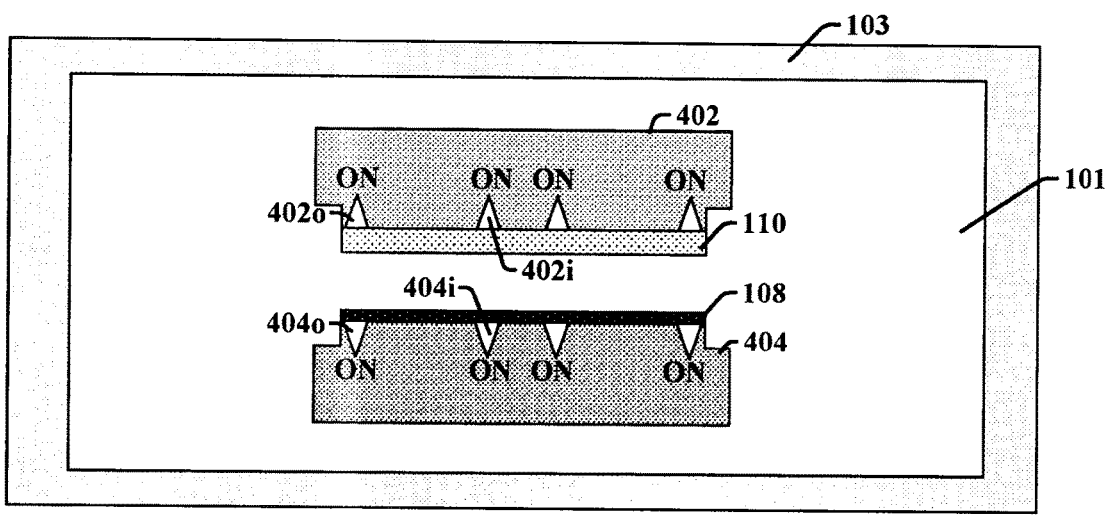
FIGS. 14-18, 19A, 19B, and 20 illustrate cross-sectional views of some embodiments of a method for wafer bonding comprising a top ESC and a bottom ESC.

As shown in the cross-sectional view 1400 of FIG. 14, the bottom wafer 108 is aligned on the bottom ESC 404 and the top wafer 110 is aligned on the top ESC 402. In some embodiments, the bottom wafer 108 is aligned over the bottom ESC 404 using a notch alignment mark (202 of FIG. 2B). The bottom wafer 108 is held onto the bottom ESC 404 by applying a first voltage bias to the first pair of inner electrostatic contacts 404*i* and the first pair of outer electrostatic contacts 404*o*, and the bottom wafer 108 is substantially flat. Thus, the first voltage bias turns "ON" the first pair of inner electrostatic contacts 404*i* and the first pair of outer electrostatic contacts 404*o* to electrostatically hold the bottom wafer 108 onto the bottom ESC 404 at the first pair of inner electrostatic contacts 404*i* and the first pair of outer electrostatic contacts 404*o*. Similarly, in some embodiments, the top wafer 110 is aligned to the top ESC 402 using a notch alignment mark (see, e.g., 202 of FIG. 2B). The top wafer 110 is held onto the top ESC 402 by applying the first voltage bias to the second pair of inner electrostatic contacts 402*i* and the second pair of outer electrostatic contacts 402*o*, and the top wafer 110 is substantially flat. Thus, the first voltage bias turns "ON" the second pair of inner electrostatic contacts 402*i* and the second pair of outer electrostatic contacts 402*o* to electrostatically hold the top wafer 110 onto the top ESC 402 at the second pair of inner electrostatic contacts 402*i* and the second pair of outer electrostatic contacts 402*o*. The top ESC 402 is also aligned to directly overlie the bottom ESC 404, such that top wafer 110 directly overlies the bottom wafer 108 and such that the top wafer 110 is substantially parallel with the bottom wafer 108. In some embodiments, the alignment of the bottom wafer 108 onto the bottom ESC 404 and the alignment of the top wafer 110 onto the top ESC 402 occurs in a vacuum chamber 101 defined by a vacuum housing 103. In some embodiments, gases may then be exhausted from the vacuum chamber 101 to prevent air entrapment and to set the vacuum chamber 101 to a pressure in a range of between approximately 0.01 millibar and approximately 1 millibars.

Figure 15:
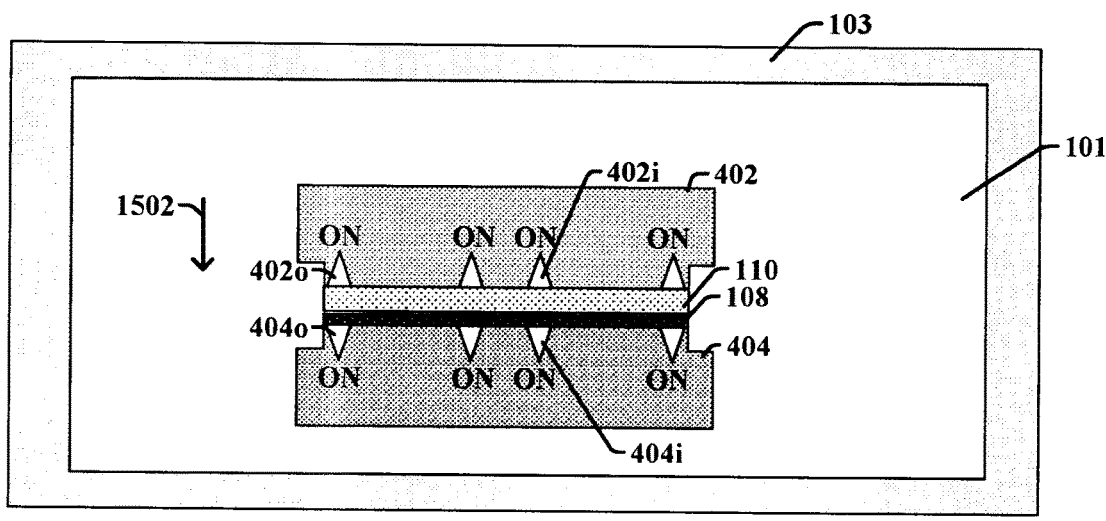

As shown in the cross-sectional view 1500 of FIG. 15, the top ESC 402 is moved 1502 towards the bottom ESC 404. In some embodiments, the top ESC 402 is moved 1502, while the bottom ESC 404 remains stationary, until the top wafer 110 just contacts the bottom wafer 108, such that a force on the bottom and top wafers 108, 110 is in a range of approximately 1 Newton and approximately 10 Newtons, in some embodiments. This range of force of between approximately 1 Newton and approximately 10 Newtons is substantially small, thereby mitigating damage to the bottom and top wafers 108, 110 and preventing wafer bonding during this step. It will be appreciated that in some embodiments, the bottom and top wafers 108, 110 are in direct contact in the cross-sectional view 1500. Although the bottom wafer 108 may be touching the top wafer 110, air entrapment is prevented because of the vacuum chamber 101. In some embodiments, the movement 1502 is conducted using the bottom ESC 404, such that the bottom ESC 404 moves towards the top ESC 402. Alternatively, in other embodiments, the bottom ESC 404 and the top ESC 402 both move towards each other.

Figure 16:
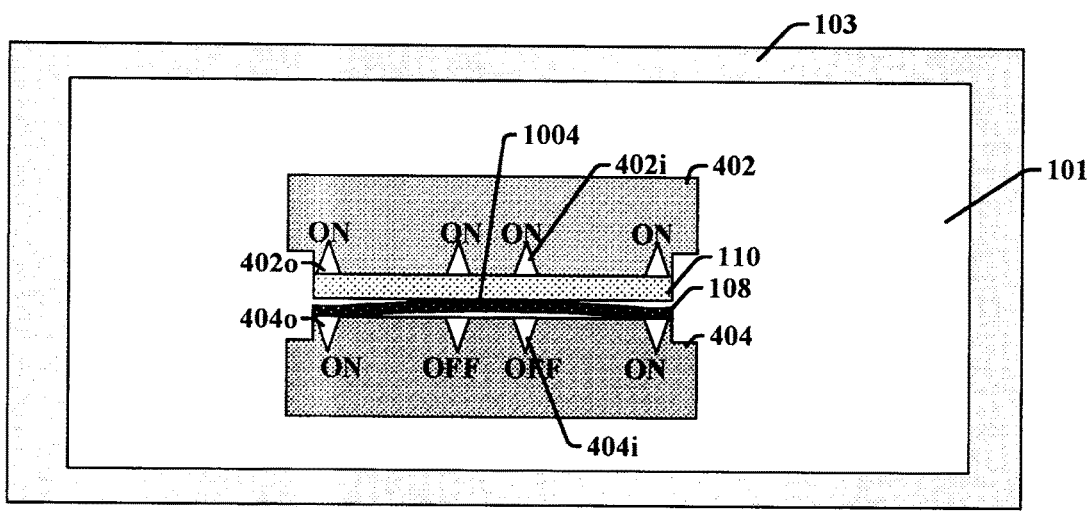

As shown in the cross-sectional view 1600 of FIG. 16, the first pair of inner electrostatic contacts 404i of the bottom ESC 404 are turned "OFF," causing the bottom wafer 108 to bend towards the top wafer 110. It will be appreciated that the bottom ESC 404 and the top ESC 402 have not moved between FIG. 15 and FIG. 16 (and do not move again until FIG. 20); however, more space is illustrated between the bottom wafer 108 and the top wafer 110 to illustrate bending of the bottom and top wafers 108, 110 to initiate wafer bonding. In some embodiments, the first pair of inner electrostatic contacts 404i and the first pair of outer electrostatic contacts 404o may be selectively turned "OFF" by applying a second voltage bias to each of the electrostatic contacts (404i, 404o) to remove the electrostatic force that holds the bottom wafer 108 onto the bottom ESC 404 at each of the electrostatic contacts (404i, 404o). Because the first pair of outer electrostatic contacts 404o are still "ON," outer edges of the bottom wafer 108 remain substantially flat and in contact with the bottom ESC 404. As the bottom wafer 108 bends towards the top wafer 110, due to the bending and the vacuum chamber 101, the bottom wafer 108 begins to bond to the top wafer 110 at the inter-wafer interface 1004. In some embodiments, the inter-wafer interface 1004 is at the centers of the bottom wafer 108 and the top wafer 110.

Figure 17:
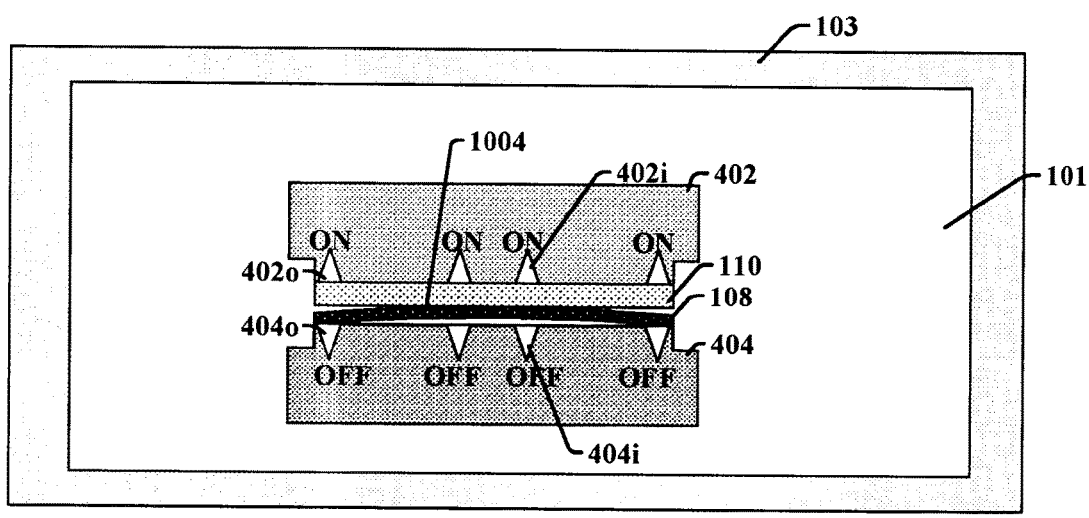

As shown in the cross-sectional view 1700 of FIG. 17, the first pair of outer electrostatic contacts 404o are then turned "OFF," causing the inter-wafer interface 1004 to begin to expand towards the outer edges of the bottom and top wafers 108, 110.

Figure 18:
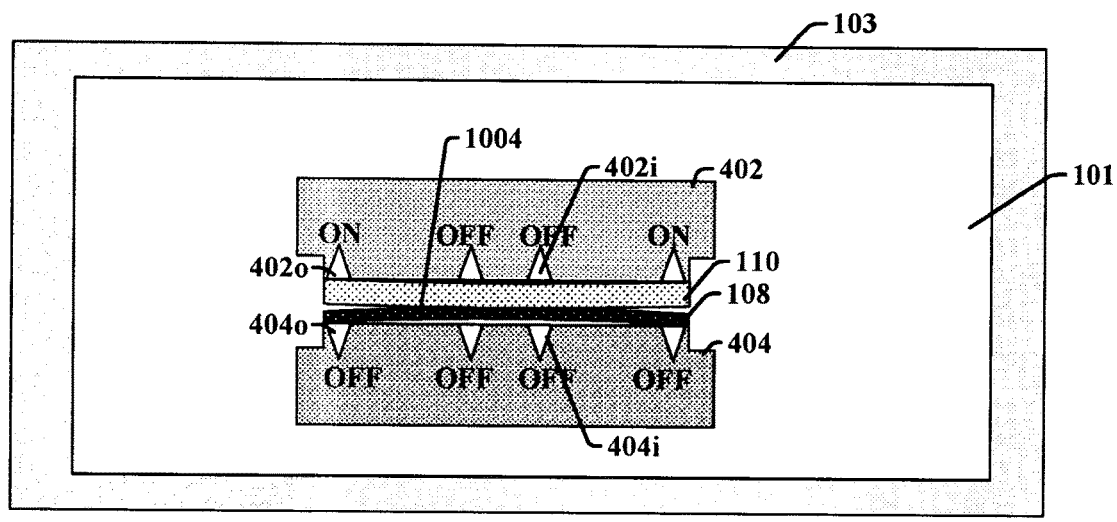

As shown in the cross-sectional view 1800 of FIG. 18, the second pair of inner electrostatic contacts 402i of the top ESC 402 are then turned "OFF," causing the top wafer 110 to bend towards the bottom wafer 108 and causing the inter-wafer interface 1004 to further expand towards the outer edges of the bottom and top wafers 108, 110. In some embodiments, the second pair of inner electrostatic contacts 402i and the second pair of outer electrostatic contacts 402o may be selectively turned "OFF" by applying the second voltage bias to each of the electrostatic contacts (402i, 402o) to remove the electrostatic force that holds the top wafer 110 onto the top ESC 402 at each of the electrostatic contacts (402i, 402o). The top wafer 110 has a concave up shape, with respect to a top surface of the bottom ESC 404. Further, upon the bending of the top wafer 110, the bottom wafer 108 in the cross-sectional view 1800 of FIG. 18 begins to flatten towards the bottom ESC 404 compared to the bottom wafer 108 in the cross-sectional view 1700 of FIG. 17.

Figure 19A:
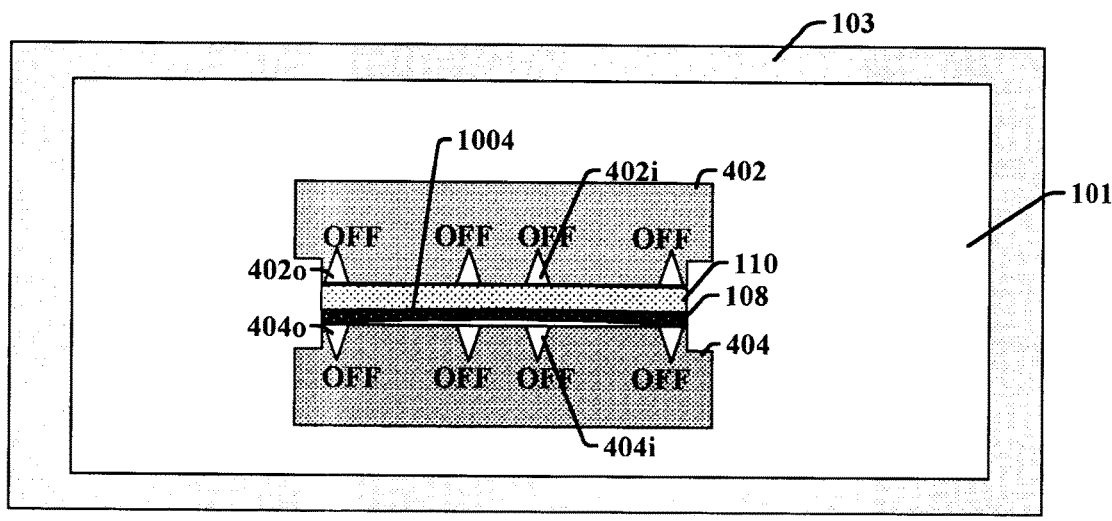

As shown in the cross-sectional view 1900A of FIG. 19A, the second pair of outer electrostatic contacts 402o are then turned "OFF," causing the top wafer 110 to further bend towards the bottom wafer 108 and causing the inter-wafer interface 1004 to further expand towards the outer edges of the bottom and top wafers 108 110. The top wafer 110 has a concave down shape with respect to the top surface of the bottom ESC 404. In other words, in some embodiments, when the second pair of outer electrostatic contacts 402o are turned "OFF," the concavity of the top wafer 110 changes from, for example, concave up (see 110 in FIG. 18) to concave down (see 110 in FIG. 19A). The cross-sectional view 1900A of FIG. 19A shows the bottom and top wafers 108, 110 at a first time just after the second pair of outer electrostatic contacts 402o are turned "OFF."

Figure 19B:
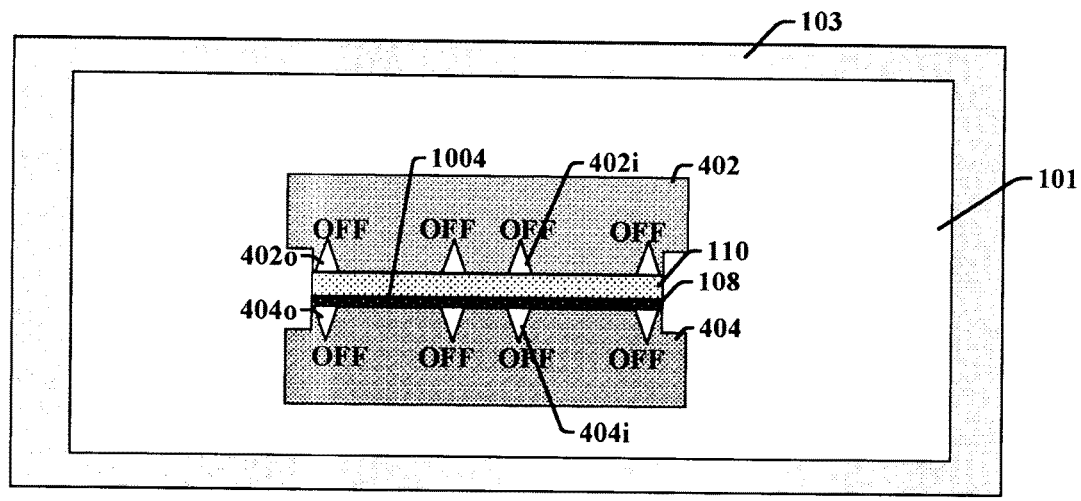

As shown in the cross-sectional view 1900B of FIG. 19B, the bottom and top wafers 108, 110 are completely bonded, indicating the completion of the inter-wafer interface 1004 expansion from the centers of the bottom and top wafers 108, 110 to the outer edges of the bottom and top wafers 108, 110. The expansion of the inter-wafer interface 1004 from the centers of the bottom and top wafers 108, 110 to the outer edges of the bottom and top wafers 108, 110 pushes air out of the inter-wafer interface 1004, mitigating air entrapment between the bottom wafer 108 and the top wafer 110, producing a more reliable wafer bond.

Figure 20:
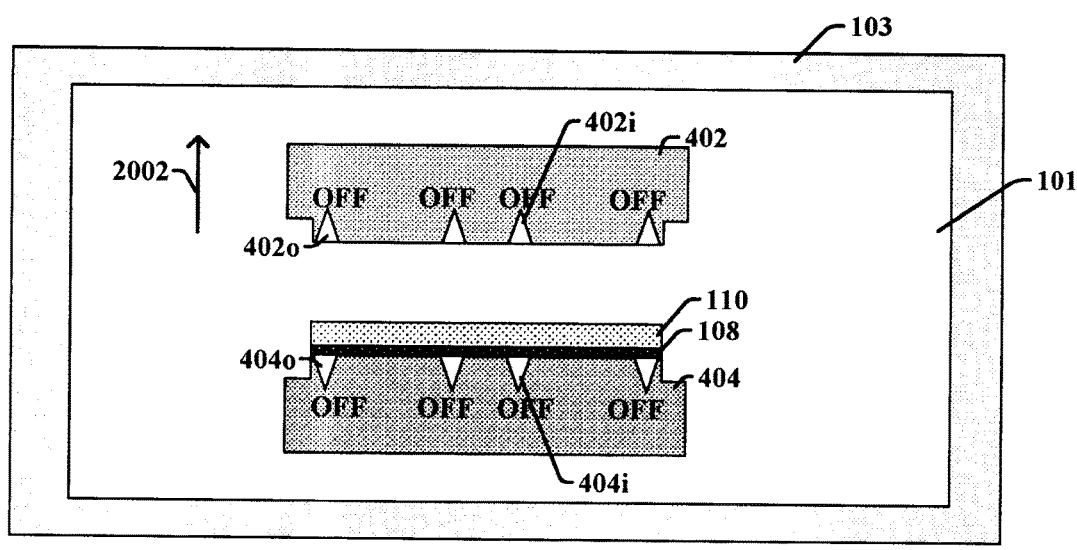

As shown in the cross-sectional view 2000 of FIG. 20, the top ESC 402 is moved 2002 away from the bottom ESC 404, such that the bonded bottom and top wafers 108, 110 may be removed from the vacuum housing 103 that defines the vacuum chamber 101 for further processing.

It will be appreciated that in some embodiments, the cross-sectional views 1400-1800, 1900A, 1900B, and 2000 occur so quickly (e.g., less than one second) and that the bottom and top wafers 108, 110 are in close contact, that the bending of the bottom and top wafers 108, 110 are not as clearly visible as illustrated in FIGS. 15-18, 19A, and 19B. Further, in some alternative embodiments of the method illustrated in FIGS. 14-18, 19A, 19B, and 20, the order of turning "OFF" the electrostatic contacts (404i/404o and 402i/402o), may be as follows: the second pair of inner electrostatic contacts 402i, followed by the second pair of outer electrostatic contacts 402o, followed by the first pair of inner electrostatic contacts 404i, and followed by the first pair of outer electrostatic contacts 404o. In other embodiments of the method illustrated in FIGS. 14-18, 19A, 19B, and 20, the order of turning "OFF" the electrostatic contacts (404i/404o and 402i/402o) may be as follows: the first pair of inner electrostatic contacts 404i and the first pair of outer electrostatic contacts 404o turned "OFF" at a first time, and the second pair of inner electrostatic contacts 402i and the second pair of outer electrostatic contacts 402o turned "OFF" at a second time, wherein the first time is before or after the second time.

Figure 21:
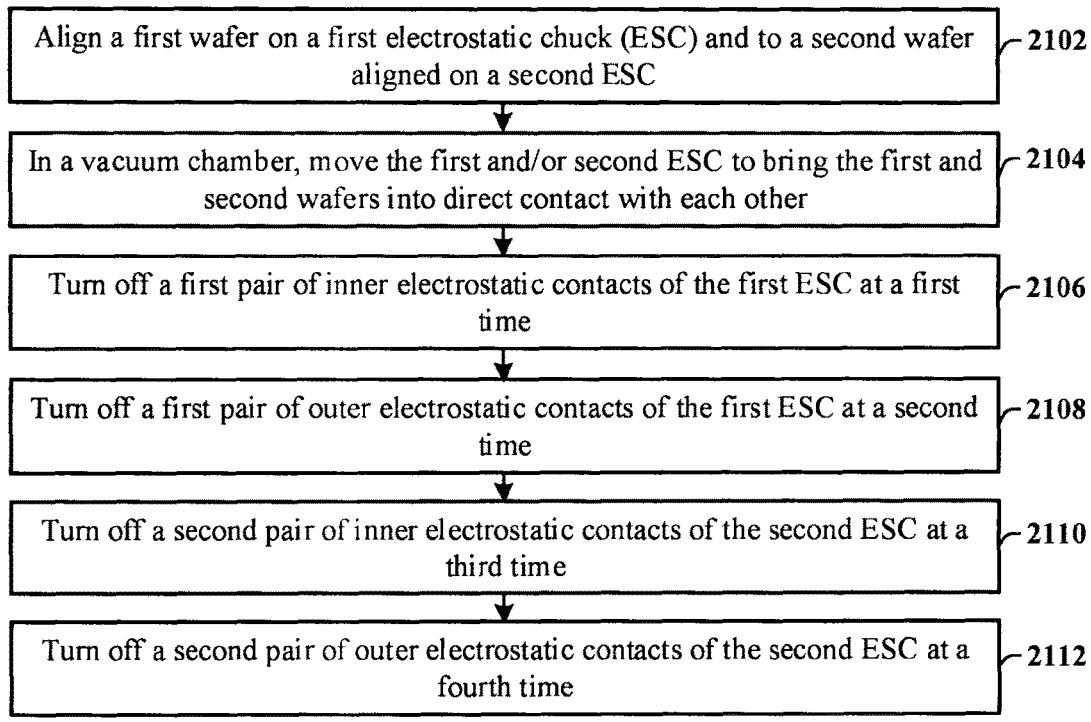
FIG. 21 illustrates a flow diagram of some embodiments of the method of FIGS. 14-18, 19A, 19B, and 20.

FIG. 21 illustrates a flow diagram of some embodiments of a method 2100 of bonding a top wafer to a bottom wafer using a top ESC and a bottom ESC in a vacuum chamber as shown in FIGS. 14-18, 19A, 19B, and 20. In some embodiments, the bottom wafer corresponds to a first wafer and the bottom ESC corresponds to a first ESC. In some embodiments, the top wafer corresponds to a second wafer and the top ESC corresponds to a second ESC.

While method 2100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2102, a first wafer is aligned on a first electrostatic chuck (ESC) and to a second wafer aligned on a second ESC. FIG. 14 illustrates a cross-sectional view 1400 of some embodiments corresponding to act 2102.

At 2104, in a vacuum chamber, the first and/or second ESC are moved to bring the first and second wafers into direct contact with each other. FIG. 15 illustrates a cross-sectional view 1500 of some embodiments corresponding to act 2104.

At 2106, a first pair of inner electrostatic contacts of the first ESC are turned off at a first time. FIG. 16 illustrates a cross-sectional view 1600 of some embodiments corresponding to act 2106.

At 2108, a first pair of outer electrostatic contacts of the first ESC are turned off at a second time. FIG. 17 illustrates a cross-sectional view 1700 of some embodiments corresponding to act 2108.

At 2110, a second pair of inner electrostatic contacts of the second ESC are turned off at a third time. FIG. 18 illustrates a cross-sectional view 1800 of some embodiments corresponding to act 2110.

At 2112, a second pair of outer electrostatic contacts of the second ESC are turned off at a fourth time. FIGS. 19A and 19B illustrate cross-sectional views 1900A and 1900B of some embodiments corresponding to act 2112.

In some embodiments, the method in FIGS. 5-12 is used to bond a top wafer 110 to a bottom wafer 108 when both the top wafer 110 and the bottom wafer 108 have low warpage defined by warpage less than 200 micrometers. In other embodiments, if the top wafer 110 and/or the bottom wafer 108 have warpage that is greater than 200 micrometers, the method in FIGS. 14-20 may be more suitable because the bottom wafer 108 and the top wafer 110 are secured onto the bottom ESC 404 and the top ESC 402, respectively, which each have multiple electrostatic contacts (404i/404o and 402i/402o) to reduce warpage during wafer bonding. Nevertheless, it will be appreciated that the method in FIGS. 5-12 and the method in FIGS. 14-20 both mitigate air entrapment.

Therefore, the present disclosure relates to a new method of deforming a first wafer with respect to a second wafer to initiate bonding at a wafer-interface, wherein the wafer-interface expands from centers of the first and second wafers to outer edges of the first and second wafers. The new method of the present disclosure reduces the force applied to the first and second wafers and mitigates air entrapment, thereby producing a reliable bond between a first and second wafer without damaging the first or second wafers.

Accordingly, in some embodiments, the present disclosure relates to a method for bonding a first wafer to a second wafer, the method comprising: aligning the first wafer with the second wafer, wherein the first and second wafers are vertically stacked and have substantially planar profiles extending laterally in parallel; bringing the first and second wafers into direct contact with each other at an inter-wafer interface, wherein the bringing of the first and second wafers into direct contact comprises deforming the first wafer so the first wafer has a curved profile and the inter-wafer interface is localized to a center of the first wafer, wherein the second wafer maintains the substantially planar profile throughout the deforming of the first wafer; and deforming the first wafer and/or the second wafer to gradually expand the inter-wafer interface from the center of the first wafer to an edge of the first wafer.

In other embodiments, the present disclosure relates to a wafer bonding apparatus, comprising: a bottom wafer chuck having a top surface configured to hold a bottom wafer; a plurality of flags evenly spaced along a periphery of the bottom wafer chuck, wherein the plurality of flags are individually configured to move between a first orientation and a second orientation, wherein an inner portion of each flag directly overlies an outer portion of the bottom wafer chuck in the first orientation, and wherein the inner portion of each flag does not overlie the bottom wafer chuck in the second orientation; a top head that directly overlies the bottom wafer chuck, wherein the top head is configured to vertically move towards and away from the bottom wafer chuck; a center pin embedded in a bottom surface of the top head, wherein the bottom surface of the top head faces the top surface of the bottom wafer chuck, and wherein the center pin has a bottommost surface that extends below the bottom surface of the top head; and wherein the wafer bonding apparatus is located in a vacuum chamber.

In yet other embodiments, the present disclosure relates to a method for bonding a first wafer to a second wafer, the method comprising: aligning the first wafer to the second wafer, wherein the first and second wafers are between and respectively on a first electrostatic chuck (ESC) and a second ESC, and wherein the first and second ESCs each comprises a pair of outer electrostatic contacts and a pair of inner electrostatic contacts between the outer electrostatic contacts; turning ON the inner and outer electrostatic contacts of the first and second ESC to respectively electrostatically attract the first and second wafers; moving the first and/or second ESC to bring the first and second wafers into direct contact with each other; turning OFF the inner electrostatic contacts of the first ESC, but not the outer electrostatic contacts of the first ESC and the inner and outer electrostatic contacts of the second ESC, at a first time; turning OFF the outer electrostatic contact of the first ESC, but not the inner and outer electrostatic contacts of the second ESC, at a second time; turning OFF the inner electrostatic contacts of the second ESC, but not the outer electrostatic contacts of the second ESC, at a third time; and turning OFF the outer electrostatic contacts of the second ESC at a fourth time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer bonding apparatus, comprising:
 a bottom wafer chuck having a top surface configured to hold a bottom wafer;
 a plurality of flags evenly spaced along a periphery of the bottom wafer chuck and individually configured to move between a first orientation and a second orientation, wherein each flag directly overlies the bottom wafer chuck in the first orientation and is laterally offset from the bottom wafer chuck in the second orientation, and wherein each flag has a tapered cross-sectional profile that tapers towards a center of the bottom wafer chuck;
a top head that directly overlies the bottom wafer chuck, wherein the top head is configured to vertically move towards and away from the bottom wafer chuck; and
a center pin embedded in a bottom surface of the top head, wherein the bottom surface of the top head faces the top surface of the bottom wafer chuck, and wherein the center pin has a bottommost surface that extends below the bottom surface of the top head;
wherein the bottom wafer chuck and the top head are located in a vacuum chamber.

2. The wafer bonding apparatus of claim 1, wherein the plurality of flags are configured to separate a top surface of the bottom wafer from a bottom surface of a top wafer overlying the bottom wafer while in the first orientation.

3. The wafer bonding apparatus of claim 1, wherein the center pin comprises a softer material than silicon.

4. The wafer bonding apparatus of claim 1, wherein the plurality of flags comprise a softer material than silicon.

5. The wafer bonding apparatus of claim 1, further comprising:
a clamp configured to hold a top wafer in place on top of the plurality of flags in the first orientation.

6. The wafer bonding apparatus of claim 1, wherein the bottom wafer chuck is an electrostatic chuck having a pair of outer electrostatic contacts and a pair of inner electrostatic contacts between the outer electrostatic contacts.

7. The wafer bonding apparatus of claim 1, wherein the bottommost surface of the center pin is concave outwards toward the bottom wafer chuck.

8. A wafer bonding apparatus, comprising:
a bottom wafer chuck having a top configured to hold a bottom wafer;
a clamp at a periphery of the bottom wafer chuck and configured to hold a top wafer in place overlying the bottom wafer;
a flag at the periphery of the bottom wafer chuck, wherein the flag is configured to separate the bottom wafer from the top wafer in a first orientation and is configured to be laterally offset from the bottom wafer and the top wafer in a second orientation;
a top head overlying the bottom wafer chuck; and
a center pin fixed in the top head, at a width-wise center of the top head, wherein the center pin protrudes from a bottom of the top head;
wherein the top head is configured to vertically move the center pin towards and away from the bottom wafer chuck.

9. The wafer bonding apparatus of claim 8, wherein the bottom of the top head has a notch configured to receive the clamp while in a downward position.

10. The wafer bonding apparatus of claim 8, wherein the clamp and the center pin comprise a softer material than silicon.

11. The wafer bonding apparatus of claim 8, wherein the top head has a width greater than a width of the bottom wafer chuck.

12. The wafer bonding apparatus of claim 8, further comprising:
a notch alignment mark configured to fit into a notch of the bottom wafer and a notch of the top wafer to align the bottom wafer and the top wafer to the bottom wafer chuck.

13. The wafer bonding apparatus of claim 8, wherein the clamp has an L-shaped cross-sectional profile.

14. The wafer bonding apparatus of claim 8, wherein the bottom wafer chuck comprises an electrostatic contact, and wherein the flag is configured to directly overlie the electrostatic contact in the first orientation.

15. The wafer bonding apparatus of claim 14, wherein the clamp is configured to directly overlie the electrostatic contact while holding the top wafer in place.

16. A wafer bonding apparatus, comprising:
a bottom wafer chuck configured to hold a bottom wafer over the bottom wafer chuck;
a top wafer chuck level with and surrounding the bottom wafer chuck and further localized to a periphery of the bottom wafer chuck, wherein the top wafer chuck comprises a clamp and a flag configured to hold a top wafer overlying the bottom wafer;
a top head overlying the bottom wafer chuck and the top wafer chuck; and
a center pin embedded in the top head and having a bottom surface recessed relative to a bottom surface of the top head.

17. The wafer bonding apparatus of claim 16, wherein a separation between the bottom surface of the center pin and the bottom surface of the top head is fixed.

18. The wafer bonding apparatus of claim 16, wherein the clamp and the flag are configured to hold the top wafer between the clamp and the flag, and wherein the flag and the clamp are each configured to move between a first position directly overlying the bottom wafer chuck and a second position laterally offset from the bottom wafer chuck.

19. The wafer bonding apparatus of claim 18, wherein the top wafer chuck extends in a circular path around the bottom wafer chuck, and wherein the flag is configured to move between the first position of the flag and the second position of the flag linearly in a radial direction of the circular path.

20. The wafer bonding apparatus of claim 16, wherein the flag has a triangular cross-sectional profile.

* * * * *